(12) United States Patent
Wang (10) Patent No.: US 11,676,794 B2
(45) Date of Patent: *Jun. 13, 2023

(54) SUPER-RESOLUTION MICROSCOPY

(71) Applicant: UNITED KINGDOM RESEARCH AND INNOVATION, Oxfordshire (GB)

(72) Inventor: Lin Wang, Didcot (GB)

(73) Assignee: United Kingdom Research and Innovation, Didcot (GB)

(*) Notice: Subject to any disclaimer, the term of this patent is extended or adjusted under 35 U.S.C. 154(b) by 69 days.

This patent is subject to a terminal disclaimer.

(21) Appl. No.: 17/394,553

(22) Filed: Aug. 5, 2021

(65) Prior Publication Data
US 2021/0366688 A1 Nov. 25, 2021

Related U.S. Application Data

(63) Continuation-in-part of application No. 16/495,055, filed as application No. PCT/GB2018/050648 on Mar. 14, 2018, now Pat. No. 11,086,137.

(30) Foreign Application Priority Data

Mar. 17, 2017 (GB) ...................... 1704275

(51) Int. Cl.
| | |
|---|---|
| *H01J 37/26* | (2006.01) |
| *G02B 27/58* | (2006.01) |
| *G02B 1/04* | (2006.01) |
| *G01N 21/64* | (2006.01) |
| *G02B 21/33* | (2006.01) |

(52) U.S. Cl.
CPC ............ *H01J 37/261* (2013.01); *G02B 1/041* (2013.01); *G02B 27/58* (2013.01); *G01N 21/6458* (2013.01); *G01N 2021/6478* (2013.01); *G02B 21/33* (2013.01); *H01J 2237/2001* (2013.01); *H01J 2237/2801* (2013.01); *H01J 2237/2802* (2013.01); *H01J 2237/2803* (2013.01)

(58) Field of Classification Search
CPC .............. G01N 21/64; G01N 21/6458; G01N 2021/6478; G02B 21/16; G02B 21/33; G02B 21/367; G02B 27/58; H01J 37/261; H01J 2237/2001; H01J 2237/2801; H01J 2237/2802; H01J 2237/2803
See application file for complete search history.

(56) References Cited

U.S. PATENT DOCUMENTS

| | | | | |
|---|---|---|---|---|
| 5,789,750 A | * | 8/1998 | Nuss ................... | H01Q 3/2676 |
| | | | | 250/341.1 |
| 11,086,137 B2 | * | 8/2021 | Wang ................... | G02B 21/16 |

FOREIGN PATENT DOCUMENTS

| | | | | |
|---|---|---|---|---|
| JP | 2016119300 A | | 6/2016 | |
| WO | WO-0186326 A2 | * | 11/2001 | ............... G02B 3/04 |

OTHER PUBLICATIONS

Xie Jin et al., "Single-point diamond mirror turning of infrared aspheric lens," Optics and Precision Engineering, vol. 12 No. 6, pp. 566-569, Dec. 2004. (Year: 2004).*

(Continued)

*Primary Examiner* — Mark R Gaworecki
(74) *Attorney, Agent, or Firm* — Lathrop GPM LLP (57) ABSTRACT

We describe a super-resolution optical microscopy technique in which a sample is located on or adjacent to the planar surface of an aplanatic solid immersion lens and placed in a cryogenic environment.

20 Claims, 6 Drawing Sheets

(56) References Cited

OTHER PUBLICATIONS

EP Application No. 18 714 023.1-1020, Examination Report dated Jul. 30, 2021, 9 pages.
Liau Z L et al., Solid-Immersion Fluorescence microscopy with Increased Emission and Super Resolution, Journal of Applied Physics, American Institute of Physics, US, vol. 117, No. 1, Jan. 7, 2015.
Chinese Application No. 20188032094.7, Second Office Action dated Sep. 10, 2021, 19 pages.
Japanese Application No. 2019-551292, Examination Report dated Oct. 29, 2021, 8 pages.

* cited by examiner

SUPER-RESOLUTION MICROSCOPY

RELATED APPLICATIONS

This application is a continuation-in-part of U.S. patent application Ser. No. 16/495,055, filed Sep. 17, 2019, which is a 35 U.S.C. § 371 filing of International Patent Application No. PCT/GB2018/050648, filed Mar. 14, 2018, which claims priority to United Kingdom Application No. 1704275.5, filed Mar. 17, 2017, the entire disclosures of which are hereby incorporated herein by reference.

FIELD

The present invention relates to methods and apparatus for carrying out super-resolution microscopy on a sample, for example using a single molecule localisation technique.

BACKGROUND

The resolution of conventional microscopy is limited due to the diffraction of light, with the achievable spatial resolution being approximately determined by the Abbe diffraction limit. The achievable spatial resolution therefore depends on optical parameters such as the numerical aperture of the objective lens, and this can be increased in various ways such as by using liquid immersion techniques in which a fluid of high refractive index is used to optically couple the objective lens and the sample to be imaged.

Various additional techniques for overcoming the spatial resolution limits of optical imaging systems beyond changing the optical configuration have also been developed in the prior art, and may generally be referred to as techniques of super-microscopy. Such techniques include, for example, single molecule localisation techniques in which optical emitters are isolated and their positions fitted using a point spread function.

It is often desirable to carry out such super-resolution microscopy techniques at cryogenic temperatures, for example to enable accurate imaging of vitrified biological samples. The invention therefore addresses these and other aspects of the prior art.

SUMMARY OF THE INVENTION

It has been found that further improving the resolution of super-resolution microscopy techniques at cryogenic temperatures is made more difficult due to the difficulties of using wet immersion objective lenses, because the fluids used for wet immersion in normal microscopy are not suitable for such low temperatures. The invention therefore proposes the use of solid immersion lenses in super-resolution microscopy at cryogenic temperatures. Advantageously, aplanatic solid immersion lenses may be used for this purpose to further enhance the resolution obtained using the chosen super-resolution microscopy technique, without the difficulties of using wet objective immersion fluids.

The invention is applicable, for example, to super-resolution techniques such as single molecule localisation microscopy techniques. The proposed solid immersion lens increases the numerical aperture of the objective—solid immersion lens system, thereby improving the available resolution of the microscopy technique.

Combining the single molecule localisation microscopy technique or other super-resolution optical microscopy techniques at cryogenic temperatures with aplanatic solid immersion lenses in this way enables image resolutions of a few tens of nanometers to be achieved in cryogenic conditions, and therefore provides image resolutions suitable for combining with electron microscopy images of the same samples at similar resolutions in correlative imaging operations. Such correlative imaging between these two techniques may be particularly advantageous in imaging biological samples preserved in a near native state using vitrification techniques.

The invention also provides for high throughput imaging using the described aplanatic solid immersion lenses through use of arrays of such lenses, with such arrays being used if required in both the super-resolution and electron microscope stages of the correlative imaging process.

The invention therefore provides a method of carrying out super-resolution microscopy on a sample, comprising: providing an aplanatic solid immersion lens; providing or locating the sample on or adjacent to the aplanatic solid immersion; locating the sample in an cryogenic environment; and imaging the sample through the aplanatic solid immersion lens using a super-resolution microscopy technique. In this way a super-resolution image of the sample may be generated, typically as digital data representing pixels of such an image, and having a resolution greater than the diffraction limit of the optical arrangement including the aplanatic solid immersion lens used for optical imaging of the sample, typically in conjunction with a dry objective lens. The sample may in particular be located at a planar truncation surface of the solid immersion lens which is otherwise defined by an opposing spherical surface, typically having a precise geometry.

Typically the sample will be disposed on and in contact with a planar surface of the aplanatic solid immersion lens.

The cryogenic environment may be defined by one or more ranges or limits of temperature, for example a temperature of less than 200 Kelvin, or a temperature of less than 100 Kelvin, or may be defined by a way in which the environment is created and maintained, for example using a cryogen such as liquid nitrogen or nitrogen vapour proximal or in contact with the sample. The aplanatic solid immersion lens may be partly or wholly within the cryogenic environment, depending on how the sample and aplanatic solid immersion lens are arranged and mounted with respect to a cryostat or other arrangement for maintaining the cryogenic environment.

A variety of super-resolution microscopy techniques may be used to implement the invention, but in particular may be a single molecule localisation microscopy technique. Such a technique may comprise, for example: labelling the sample with optical emitters such as fluorophores; separately detecting each of a plurality of optical emissions from the emitters, the optical emissions being received at a detector through the aplanatic solid immersion lens while the sample is located in the cryogenic environment; and constructing the super-resolution image of the sample from the detected optical emissions. For example, each detected optical emission in an image of the sample may be fitted to a point spread function so as to determine a position of the emitter to an accuracy greater than that determined by the diffraction limit of the microscope arrangement. Multiple images of the sample are typically taken over time to build up a sufficient density of detected emissions.

In such a method, each fluorophore is typically a fluorophore molecule which becomes bonded to a molecule of the sample during sample preparation. Typical fluorophores which may be used with biological samples such as cells and organelles include Alexa Fluor and Atto dyes.

In particular, the single molecule localisation microscopy technique may be a stochastic optical reconstruction microscopy technique, generally referred to in the prior art as a STORM technique.

The imaging of the sample using a super-resolution optical microscopy technique may comprise illuminating the sample using probe light subject to total internal reflection within the aplanatic solid immersion lens at the planar surface. In this way, the portion of the sample imaged may be confined to a few tens of nanometers, for example less than 100 nm, in depth relative to the planar surface.

The methods of the invention may comprise carrying out such super-resolution microscopy on an array of samples by providing an array of the aplanatic solid immersion lenses, such that the array can be handled as a single unit. Typically, the array will comprise the aplanatic solid immersion lenses integrally formed with a substrate such as a planar substrate, for example by milling or moulding from or as a single piece of material including both the lenses and substrate, although the lenses could be formed by bonding our coupling suitable sub-lens components to a suitable planar substrate.

The invention may then be implemented by locating or mounting the each sample on or adjacent to the planar surface of a corresponding one of the aplanatic solid immersion lenses and locating the samples mounted in this way in a cryogenic environment; and imaging each of a plurality of the samples using the respective adjacent aplanatic solid immersion lens using a super-resolution microscopy technique. Typically, each of a plurality of the samples will be imaged sequentially, although simultaneous parallel imaging may be possible in some arrangements.

Whether individual aplanatic solid immersion lenses are used, or such lenses in an array, the or each sample on or adjacent to the or each aplanatic solid immersion lens may be loaded into a cryostat prior to the super-resolution imaging. A cryogen may then be introduced into the cryostat to maintain the or each sample in the cryogenic environment for the super-resolution imaging. The or each sample may be vitrified, or maintained in a vitrified state for the super-resolution imaging, for example in order to provide improved imaging of biological samples, including where such samples have been or are also to be imaged using a correlative electron microscopy or soft X-ray technique as discussed below.

The invention therefore also provides a method of correlative imaging comprising the steps of: carrying out the above described steps to provide a super-resolution optical image of the or each sample; carrying out electron microscopy or X-ray microscopy on the or each sample to provide an electron microscopy or X-ray image of the or each sample; and combining or aligning or correlating the super-resolution optical image and the electron microscopy image of each sample to provide a correlative image or images of the sample.

The electron microscopy may typically be carried out subsequently to the super-resolution optical imaging, but could instead be carried out beforehand. The electron microscopy technique may be one of many available techniques, such as transmission electron microscopy (TEM) or scanning electron microscope (SEM). Soft X-ray microscopy technique may be also used to generate correlative optical and X-ray images. The or each sample may also be maintained in a vitrified state for the electron or X-ray microscopy.

The invention also provides apparatus corresponding and relating to the methods discussed herein, for example apparatus for carrying out super-resolution microscopy on a sample, comprising: an aplanatic solid immersion lens having a planar truncation surface; a sample disposed on or adjacent to the planar surface; a cryogenic environment in which the sample is located; and a super-resolution optical microscope arranged to provide a super-resolution image of the sample.

The invention also provides an array of aplanatic solid immersion lenses for use in cryogenic super-resolution microscopy, the array comprising a plurality of solid immersion lenses, and more particularly aplanatic solid immersion lenses, integrally formed with, or bonded to a substrate. Typically, a planar surface of the substrate may provide the planar optical surface of each of the aplanatic solid immersion lenses at which the sample is to be disposed, and a separate sample may be provided on or adjacent to the planar surface of each aplanatic solid immersion lens. The array of aplanatic solid immersion lenses may be formed of a material having a refractive index of at least 2.0, such as zirconium dioxide or diamond, and/or of a material having a hardness on the Mohs scale of at least 8.0. In these or other embodiments the array may be formed of a crystalline material such as zirconium dioxide or diamond.

The substrate of the array may be substantially circular in plan view, or of other shapes, and the diameter or length of the substrate may be 50 mm or less, or 30 mm or less, or substantially 25 mm.

The invention also provides a method of manufacturing an array of aplanatic solid immersion lenses for use in cryogenic super-resolution optical microscopy, comprising forming the plurality of aplanatic solid immersion lenses integrally with a substrate.

For example, the method may comprise forming the array by machining and/or diamond turning. When such machining techniques are used, or in other circumstances, the array may be formed of a crystalline material, and/or a material having a hardness on the Mohs scale of at least 8.0, and/or a refractive index of at least 2.0

The method may comprise 3D printing the array, for example from a plastics material such as an acrylic plastic. The material used to form the array by 3D printing may have a refractive index of at least 1.4.

Alternatively, the array may be formed using a sol-gel process, for example to form the array from a synthesised metal doped polymer. The refractive index of an array formed using a sol-gel process, for example from a synthesised metal doped polymer, may be at least 1.8.

The invention also provides an array of solid immersion lenses integrally formed with a substrate for use in a cryogenic environment, the array being formed by diamond turning of a crystalline material having a refractive index of at least 2.0.

The invention also provides a cryostat for use in carrying out super-resolution microscopy on a plurality of samples, the cryostat comprising a frame arranged to accept an array of aplanatic solid immersion lenses disposed on or integrated with a substrate, as set out above, the cryostat being configured such that the array of aplanatic solid immersion lenses forms a floor of the cryostat. Typically, then, the spherical surface of each of the lenses faces or protrudes outwards or downwards from the cryostat, and the samples are located inside the cryostat. The cryostat may then be flushed with a cryogen, such as liquid nitrogen, to maintain the samples in the required cryogenic environment for the microscopy processes.

BRIEF DESCRIPTION OF THE DRAWINGS

Embodiments of the invention will now be described, by way of example only, with reference to the accompanying drawings of which.

DETAILED DESCRIPTION OF EMBODIMENTS

Figure 1:
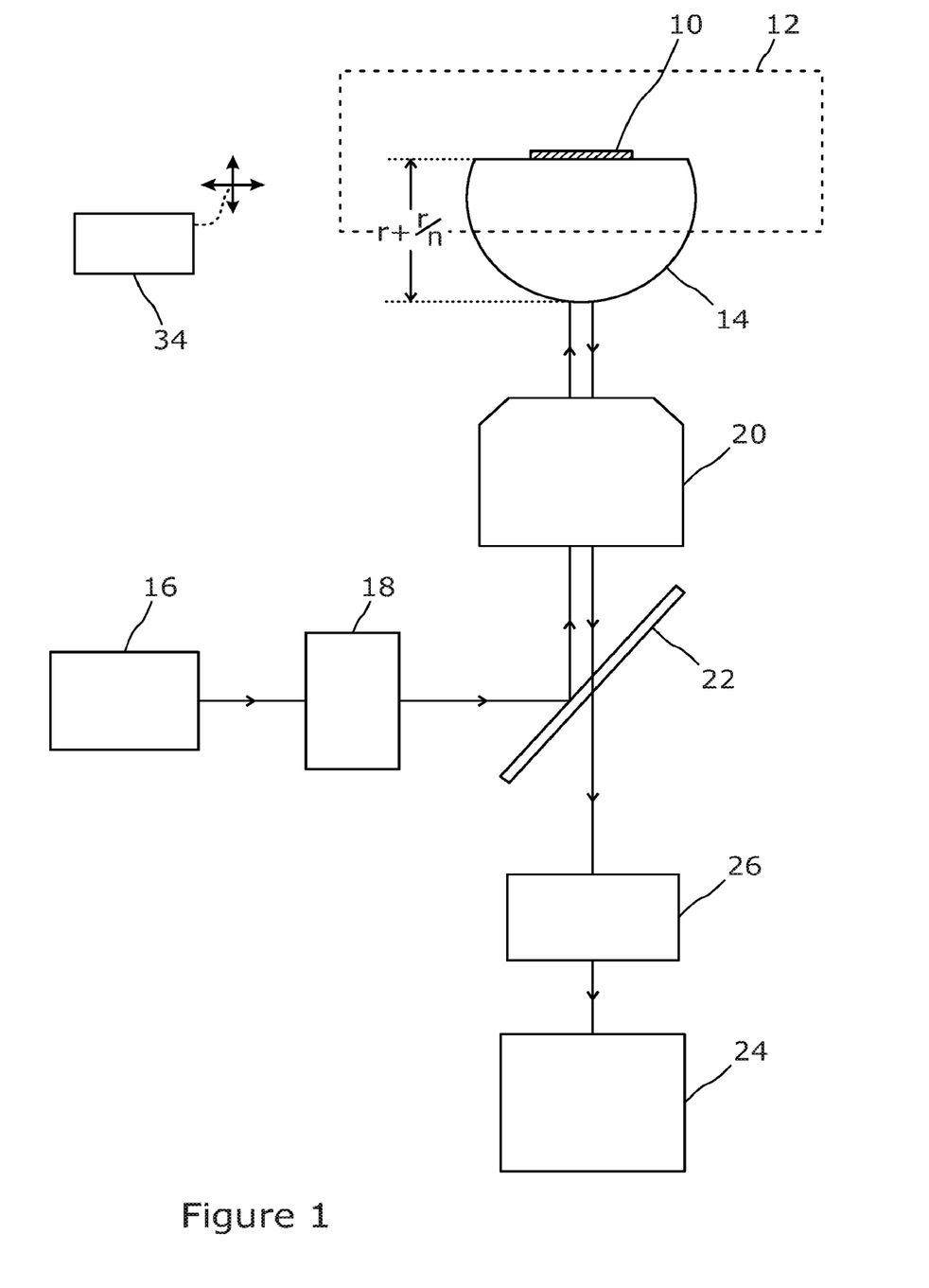
FIG. 1 provides a schematic illustration of apparatus for carrying out super-resolution microscopy on a sample located in a cryogenic environment.

Referring now to FIG. 1 there is illustrated apparatus for carrying out super-resolution optical microscopy on a sample 10 in a cryogenic environment 12. The sample 10 is located adjacent to or in contact with the planar surface of an aplanatic solid immersion lens 14 (ASIL). One or more light sources 16 are used to form probe light which is typically conditioned or controlled using probe light optics 18 before being passed to an objective lens 20, for example by way of a beam splitter 22. The objective lens 20 is directed at the ASIL 14 so as to deliver the probe light to the sample, and so as to collect image light from the sample for passing to one or more imaging elements 24 such as a CCD or CCD camera. The path of the image light from the sample 10 through the ASIL to the one or more imaging elements 24 may be by way of beam splitter 22 and image light optics 26.

At least the sample 10 is contained within the cryogenic environment, but some or all of the ASIL 14 may also conveniently be contained within the cryogenic environment, as discussed in more detail below. The cryogenic environment may be such that the sample is at a temperature of less than 200 Kelvin, less than 100 Kelvin, or alternatively may be defined by being maintained using liquid nitrogen or another cryogen, for example such a cryogen proximal to or in contact with the sample 10 and/or the ASIL 14.

The sample 10 may be, for example, a thin sample or film of or containing biological or other material, such as one or more cells, organelles, membranes or the like. Alternatively, the sample may be provided by a surface region of a thicker sample element such as an element formed of a biological or non biological material, such as a block of an inorganic material to be studied, for example comprising quantum dots. The sample may be in contact with the ASIL as illustrated in FIG. 1, or may be displaced slightly from the surface of the ASIL, typically by less than 100 nm.

The arrangement of FIG. 1 is used to carry out super-resolution microscopy on the sample 10 in the cryogenic environment 12. The super-resolution microscopy is used to achieve an image resolution of the sample which exceeds the diffraction limit of the optical arrangement used. In the arrangement of FIG. 1, for example, the super-resolution microscopy is used to exceed the diffraction limit of the arrangement including the objective lens 20 and the ASIL 14.

A variety of different super-resolution microscopy techniques may be used, but the technique may typically be a single molecule localisation technique. Typically in such a technique, the imaging element is used to sequentially image the sample multiple times, with only a small, and different, subset of the molecules in the sample being represented in each image. In this way, individual molecules, seen as single spots, can be separately identified in each image and therefore located to better positional accuracy than the diffraction limit of the optical arrangement, for example by fitting a curve of the expected point spread function to the detected image of each molecule, and then locating the corresponding centroids. By repeating the process for a plurality of such images, an image of the sample with much higher resolution can be constructed. There are only a few types of molecules, for example, quantum dots and fluorescent proteins, in nature that can be imaged in a time-resolved manner in their native states. The majority of the samples need extra steps to be labelled with fluorescent emitters giving fluctuating intensity upon illumination.

In some such techniques, individual molecules of the sample may be labelled with optical emitters, for example fluorescent emitters, and the probe light used or controlled in such a way as to cause intermittent fluorescence events by those emitters, such that only a small subset of the emitters are emitting in each image. In some particular embodiments, the super-resolution microscopy technique may be a stochastic optical reconstruction microscopy technique, often referred to as STORM. Some particular implementations of such STORM techniques suitable for use with the invention are described in Bo Huang et al., Science 319, 810 (2008), "Three-dimensional super-resolution imaging by stochastic optical reconstruction microscopy", and Doory Kim et al., PLos ONE 10(4): e0124581, April 2015, "Correlative stochastic optical reconstruction microscopy and electron microscopy".

In preparing samples for such fluorescence imaging techniques, sample staining and labelling may be carried out in much the same way as for other fluorescence imaging techniques. Many Alexa Fluor and Atto dyes can be used for STORM imaging, for example Alexa Fluor 647. Apart from organic dyes, many fluorescent proteins, such as mEOS and PAmCherry are also suitable.

However, the invention may be used with various other super-resolution microscopy techniques to improve image resolution where locating the sample in a cryogenic environment is desirable.

An aplanatic solid immersion lens 14, as used in the present invention, is characterised by being substantially a truncated spherical ball lens of thickness $r+r/n$ (as labelled in FIG. 1) where r is the ball radius and n is the refractive index of the material of the ball lens. This differs from a hemispheric solid immersion lens in the position of the substantially planar truncation surface which in the hemispheric case provides a lens thickness of r. A hemispheric solid immersion lens substantially in contact with a sample can be used to provide a numerical aperture, in combination with an objective 20, which has a multiple n of the numerical aperture of the objective 20 alone. In contrast, an aplanatic solid immersion lens in combination with an objective 20 can achieve a numerical aperture which has a multiple $n^2$ of the numerical aperture of the objective 20 alone, up to a maximum value of n.

Figure 2A:
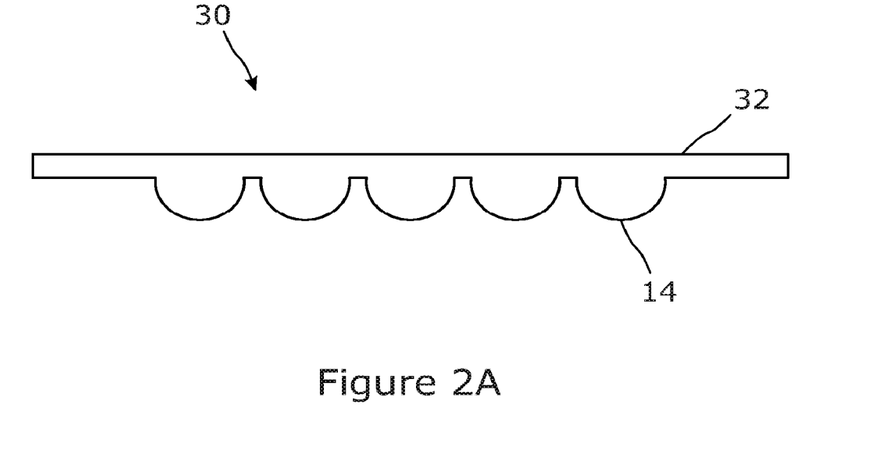
FIGS. 2A and 2B show an array of aplanatic solid immersion lenses for use in the arrangement of FIG. 1.
Figure 2B:
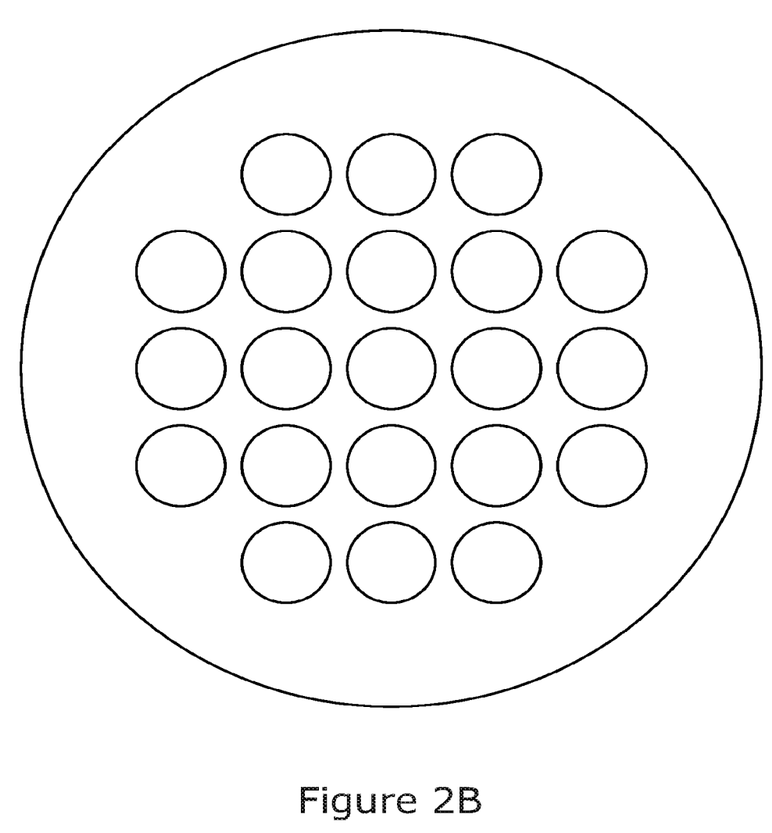

Of course, the aplanatic solid immersion lens only need be defined by the surfaces which are optically used in the respective optical arrangement, so that although the curved surface distal from the sample to be imaged is typically substantially spherical, and the surface proximal to the sample to be imaged is typically substantially planar, other portions of the aplanatic solid immersion lens do not necessarily need to complete the ball shape or ideal truncated sphere illustrated in FIG. 1, for example see the array configurations of FIGS. 2A and 2B.

An aplanatic solid immersion lens can also provide a larger effective field of view than a hemispheric solid immersion lens, although there may be some increase in chromatic aberration which can be compensated by slight variations in the spacing between the objective 20 and the ASIL 14 for different wavelengths of light. Such aberration and design considerations are discussed for example in Lin Wang et al., Applied Optics, Vol. 49, No. 31, 6160-6169.

The increase in numerical aperture resulting from the use of the ASIL in the arrangement of FIG. 1 is directly dependent on the refractive index of the material used in the ASIL. A material of high refractive index, such as zirconium dioxide with a refractive index of 2.2 may therefore be used. The size of the ASIL may be selected so as to compromise between factors such as field of view and aberration effects, but for the arrangement of FIG. 1 an ASIL with a spherical diameter of about 3 mm may be used. If the material is zirconium dioxide then this leads to a lens depth of about 2.18 mm.

Use of an ASIL 14 for carrying out super-resolution microscopy on a sample 10 in a cryogenic environment 12, as illustrated in FIG. 1, enables a higher numerical aperture to be achieved in the optical imaging arrangement, and therefore a higher precision in the super-resolution localisation of features detected by the imaging elements 24. An alternative way of achieving a higher numerical aperture would be to use a wet objective lens with a body of a high index immersion fluid body making contact with, and bridging the optical space between, the wet objective lens and the sample. However, such high index immersion fluids are not tolerant of the low temperatures associated with cryogenic environments which are often required by the nature of the sample to be studied, for example where the target structure in the sample to be imaged is an intracellular organelle or other biological structure which requires vitrification for the super-resolution imaging process to be successful. The present invention using an ASIL therefore provides both a higher numerical aperture than that available using a wet immersion lens, and tolerance of cryogenic temperatures, in carrying out super-resolution microscopy. In contrast, typical microscope immersion oils are standardised for about 23° Celsius as specified by DIN/ISO. Some immersion oils for special applications can be obtained for use at 18°, 20° or 37° Celsius.

The dry objective lens 20 should have a working distance that is long enough to accommodate the ASIL 14. For a typical working arrangement, a suitable lens could be a 50× Mitutoyo Plan Apo Infinity Corrected Long WD Objective (NA 0.55, working distance 13 mm).

According to the Rayleigh Criterion, the optical resolution of the combination of the objective lens 20 and ASIL 14 is:

$$d=0.61\lambda/(n^2 NA)$$

Here $\lambda$ is the wavelength of the collected image light, n is the refractive index of the ASIL material, and NA is the numerical aperture of the dry objective lens. Note the product of $n^2$ and NA is subject to a maximum value of n.

The resolution performance of a super-resolution technique based on detecting separate molecules in an image can then be evaluated using the localisation precision:

$$\sigma = d/\sqrt{N}$$

Here N is the photon number collected from each single molecule. Therefore, the localisation precision of such a super-resolution technique may be represented as:

$$\sigma=0.61\lambda/(n^2 NA\sqrt{N})$$

As an example, given a light wavelength of 500 nm and a conservative photon number of 1000, the localisation precision of a typical working arrangement would be 15 nm.

The apparatus of FIG. 1 and related methods may be used to efficiently image multiple samples, for example by providing an array 30 of aplanatic solid immersion lenses and locating each sample adjacent to or in contact with the planar face of a different one of the aplanatic solid immersion lenses. Such an array 30 of aplanatic solid immersion lenses is illustrated in cross section in FIG. 2A, and in plan view in FIG. 2B.

Each of the aplanatic solid immersion lenses 14 of the array may be formed integrally together with a substrate 32, for example by machining or diamond milling from a single piece of material, or by moulding, 3D printing, or sol-gel forming as a single piece of material. Alternatively, the array may be formed by separately bonding aplanatic solid immersion lens components to such a substrate to form the array of lenses.

In forming as one piece of material with the substrate, the array may be formed from any one of various different materials which are optically transparent within the operational wavelength range of the super-resolution microscopy technique, at cryogenic temperatures. For example, the material may be a relatively hard, high refractive index, crystalline material. Some suitable crystalline materials have one or more of the following properties: a hardness of at least 8.0 on the Mohs scale, and a refractive index of at least 2.0. Some such suitable materials include zirconium dioxide, or more particularly cubic zirconia (the cubic form of zirconium dioxide), and diamond. Other suitable crystalline materials include titanium dioxide, strontium titanate and tantalum pentoxide, each of which has a refractive index considerably above 2.0, and gallium phosphide.

Zirconium dioxide has a hardness of around 8.0 to 8.5, and a refractive index of around 2.1 to 2.2. Diamond has a hardness of 10, and a refractive index of about 2.4. Such hard, high refractive index, crystalline materials, or other crystalline materials, or other materials more generally, may typically be used to form the lens array by using a machining or milling technique as described in more detail below.

Alternatively a glass material, such as a crown or flint glass which typically have a refractive index of about 1.5 to 1.8, may be used, typically also using a machining or milling technique as discussed below.

Alternatively, the array may be formed from a plastics or polymer material, such as an acrylic, a polycarbonate, or a polystyrene material. A 3D printing technique may be used to form the lens array from some such or from other suitable materials, and more particularly from an acrylic plastic material. Acrylic plastics which can be printed are available with a refractive index of at least up to around 1.4 to 1.6. Although typically having a hardness of around 3-4 on the Mohs scale, hardness in excess of 7 can be achieved for some acrylic materials.

In some embodiments the array, including both the lenses and substrate, may be formed by machining from a single piece of material. The machining technique may be, or may include, diamond turning, a technique which involves milling using a cutting tool with a diamond tip. Diamond turning is typically a multi-stage process involving multiple stages of machining with lathes of increasing accuracy. A diamondtipped lathe tool is then used in the final stages of the process to achieve a sub-nanometer surface finish and a sub-micrometer form accuracy.

Such machining techniques are particularly suitable for forming a lens array from harder and/or crystalline materials, for example having a hardness of at least 8.0 on the Mohs scale, and/or from materials of higher refractive index such as above 2.0, for example zirconium dioxide or diamond materials as discussed above. However, such techniques could instead be used to form the array from a glass or from a plastics or polymer material.

In other embodiments the array, including both the lenses and substrate are formed as single unit using a moulding technique, for example from a plastic such as an acrylic, a polycarbonate, a polystyrene or other optically transparent plastics material.

In other embodiments, the array may be formed using a sol-gel process. Typically in this case the material of the array will be a synthesised metal doped polymer, in order to achieve a relatively high refractive index, for example above about 1.8.

The apparatus of FIG. 1 may be provided with a translation mechanism 34 arranged to translate the array of aplanatic solid immersion lenses laterally with respect to the objective 20 in order to sequentially image each of a plurality of the samples by bringing each respective aplanatic solid immersion lens into position with respect to the objective lens 20 for carrying out the super-resolution microscopy technique.

Suitable configurations and dimensions which may be used for arrays 30 of aplanatic solid immersion lenses such as those illustrated in FIGS. 2A and 2B are to use a square or hexagonal array of aplanatic solid immersion lenses 14. For use in typical cryogenic super-resolution microscopy applications, typically, each lens will have the same diameter. Typically the lens diameters will be from about 1.0 to 3.0 mm. The closest distance between the edges of any two lenses may be greater than the radius, or greater than the diameter, of each lens. The centre points, or optical axes, of adjacent lenses may be spaced from each other by about 3.5 mm, or by from about 2.0 to 5.0 mm.

The array may be formed with a size and shape to conform with typically biological applications and associated equipment such as preparation and analysis devices. In the figures the array is formed from 21 such aplanatic solid immersion lenses in a rectangular array, disposed on or as part of a circular or substantially circular substrate of about 25 mm in diameter, with the substrate having a thickness of about 0.7 mm which contributes to the thickness of each aplanatic solid immersion lens of the array. However, more generally the array may more generally have a diameter, length, or largest planar dimension of less than 50 mm, or more particularly less than 30 mm, and the number of lenses may be less than ten (for example 9 lenses in a square grid), or less than 25.

Although a substantially circular substrate is shown in FIG. 2B, other substrate shapes in plan view such as ovoid, square or rectangular may be used, and any such shape including circular may additionally be provided with one or more other perimeter features such as one or more notches, tags, indents or protuberances.

An advantage of using an array 30 of aplanatic solid immersion lenses and samples in conjunction with the methods and apparatus of the invention is that multiple samples can be imaged without needing to separately load each combination of an aplanatic solid immersion lens and sample into the cryogenic environment. As the distance between the ASILs is known it is convenient to precisely alter the locations of the field of view in the microscope swiftly. Therefore high-throughput imaging can be achieved.

For use in methods and apparatus according to the invention, one or more separate aplanatic solid immersion lenses, or one or more arrays 30 of such lenses, can be loaded into a cryostat 50, in order to provide the required cryogenic environment for the one or more samples to be imaged by a super-resolution microscopy technique.

Figure 3:
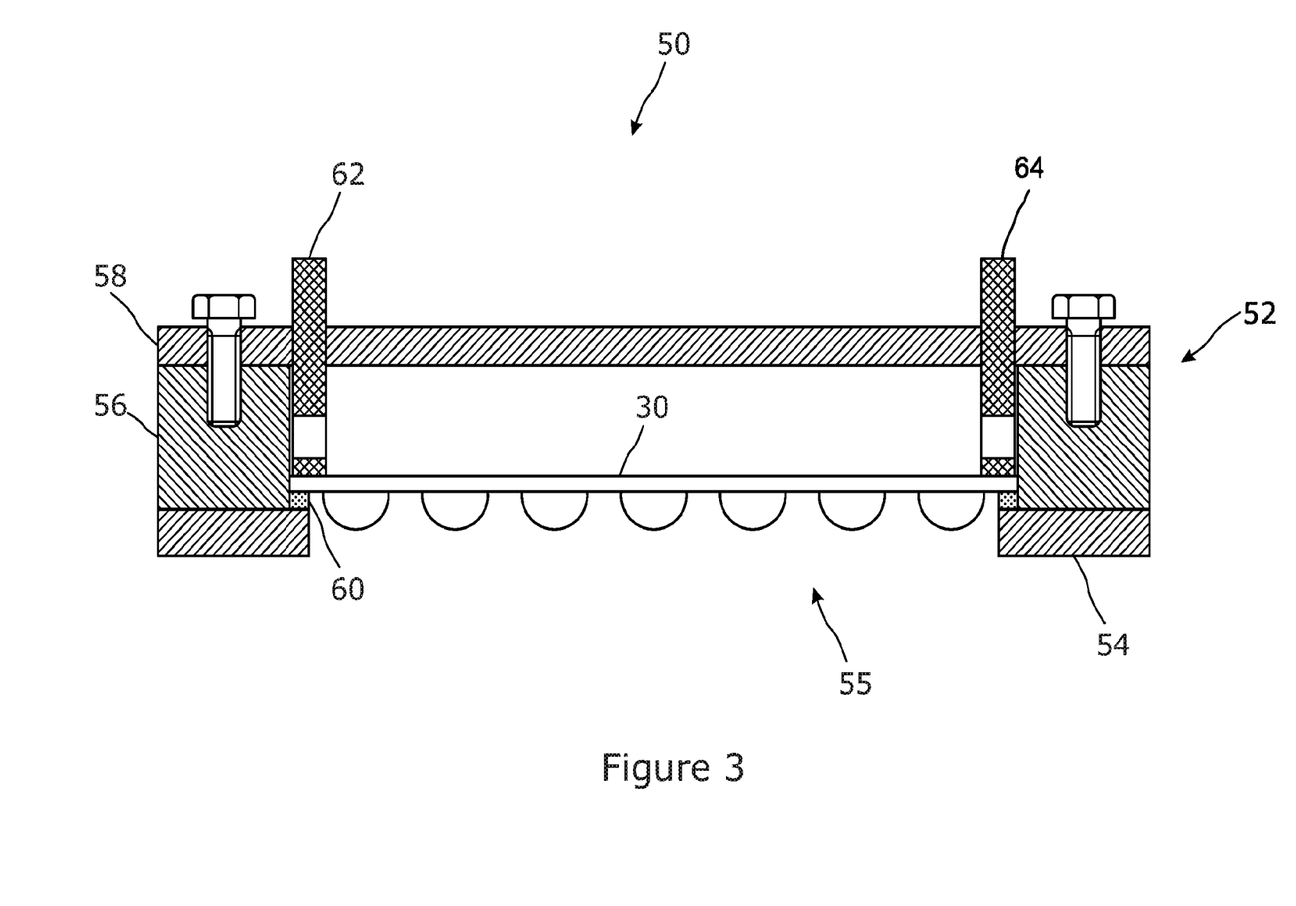
FIG. 3 illustrates a cryostat for accepting an array of aplanatic solid immersion lenses for use in the arrangement of FIG. 1.

FIG. 3 shows an example of how such a cryostat 50 may be constructed, in this case with an array 30 of aplanatic solid immersion lenses 14 loaded into the cryostat 50. To this end, the cryostat 50 comprises a frame 52 which itself comprises a base 54, a body 56 and a lid 58. The base 54 is provided with an aperture 55 through which the samples (not shown, but typically located at the planar face of each aplanatic solid immersion lens) can be imaged through the aplanatic solid immersion lenses. The body 56 is affixed onto the base 54 so as to provide the side walls of the cryostat 50, and the lens array is loaded into the cryostat so as to sit within the side walls provided by the body portion, and so as to be seated against a seal ring 60 located at the join between the base and the body. The seal ring 60 may be located, for example, against a shoulder formed by the aperture 55 in the base being slightly smaller than the inside surface of the body 56.

Using this, or similar constructions, the lens array 30 forms a base of the cryostat so as to retain a cryogen which can settle or flow on top of the lens array 30 so as to be in contact with the samples. In FIG. 3 the cryogen, such as liquid nitrogen, is introduced into the cryostat using an entry passage 62, and is allowed to leave through an exit passage 64. These entry and exit passages maybe provided in various ways, but in FIG. 3 they are provided by tubes which pass through the lid 58 of the frame 52. Using liquid nitrogen in this way can provide a typical sample temperature of about 77 Kelvin or below.

In use, the lens array 30 is first suitably prepared as necessary, for example including using nitrogen vapour to cool down to 77 Kelvin, and the samples are then applied to the planar surface of the lens array. The lens array is then loaded into the cryostat so as to form the base, and the lid 58 is then bolted or otherwise secured to close the frame 52. The cryostat already loaded with the lens array 30 and samples can then be loaded into position relative to the optics, such as the optics of FIG. 1 or as later described, and the cryogen supply connected to the entry and exit passages 62, 64 in order to carry out the required super-resolution microscopy techniques. Because multiple samples are already loaded into the cryostat and already located in the required positions relative to the aplanatic solid immersion lenses, multiple samples can be imaged more quickly and easily.

Figure 4:
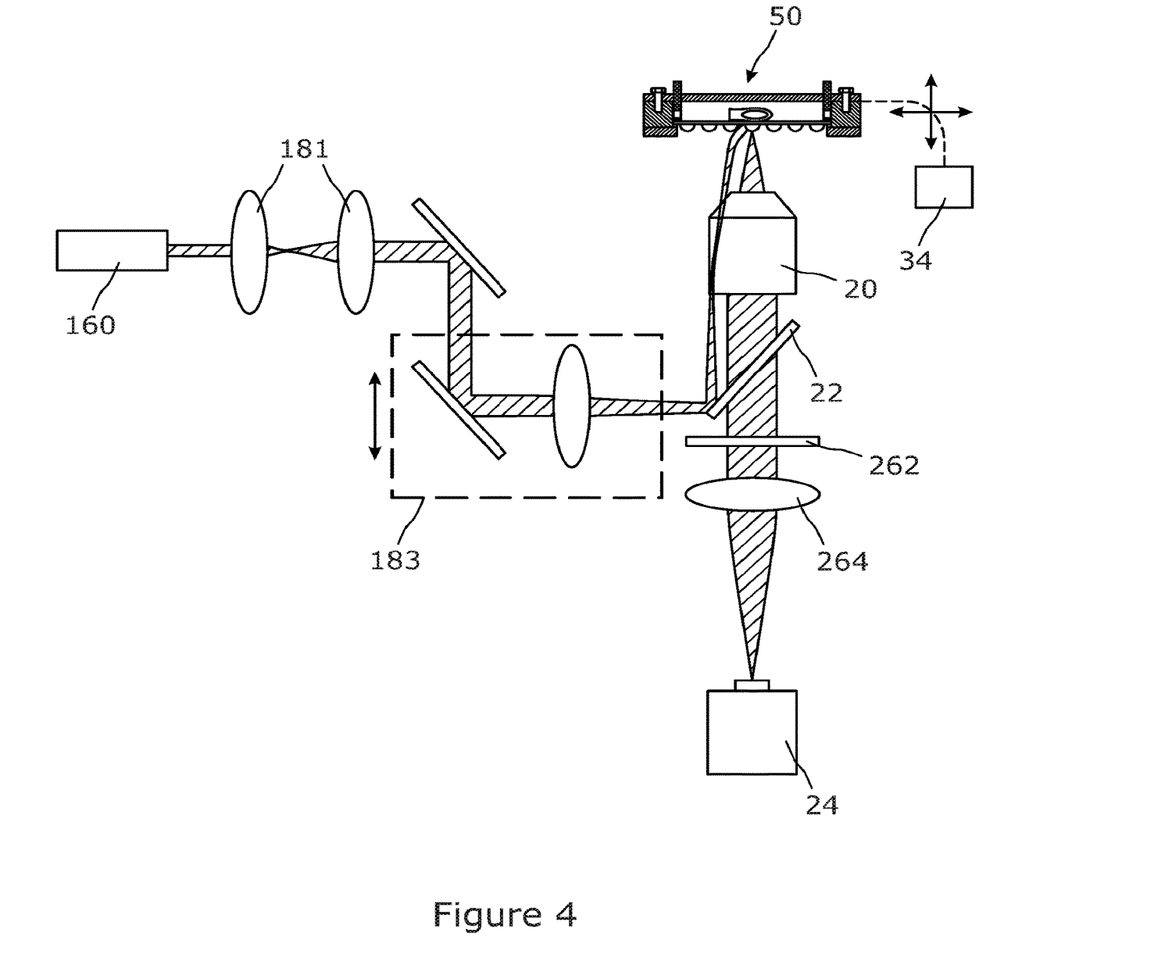
FIG. 4 shows in more detail how the optical arrangements of FIG. 1 may be provided.

FIG. 4 illustrates in more detail how the optics of FIG. 1 may be implemented to carry out super-resolution microscopy on one or more samples in a cryogenic environment, for example using a cryostat arrangement similar to that of FIG. 3. In FIG. 4 the light source 16 is provided by a laser 160, for example operating at a wavelength suitable to excite fluorophores with which molecules in the sample have been labelled. The probe light optics 18 for conditioning the probe light then comprise a beam expander arrangement 181, followed by a steering arrangement 183 comprising a mirror and a steering lens. The steering arrangement is configured such that translation of the steering arrangement controls the position of incidence of the probe light on to the dichroic beam splitter 22, and therefore its path into the objective 20.

The probe light then passes through the objective to reach the aplanatic solid immersion lens and the sample, which may be held using a cryostat arrangement such as that illustrated in FIG. 3. A translation mechanism 34, such as a long travel range x-y-z microscope translation stage system may be used to control the position of the cryostat 50, and therefore the aplanatic solid immersion lens and associated sample relative to the objective 20.

Probe light which enters the objective 20 at a greater radial displacement from the central optical axis of the objective is incident on an aplanatic solid immersion lens at which the objective 20 is directed at an increased angle of incidence. If this angle of incidence is sufficiently large then the probe light beam passes through the aplanatic solid immersion lens and arrives at the distal planar surface of that lens at an angle of incidence which is sufficient to give rise to total internal reflection within the aplanatic solid immersion lens. In this case, a sample located on the planar surface of the aplanatic solid immersion lens is illuminated only by the evanescent wave of the probe light, which has significant power only within a distance of the order of a fraction of the wavelength of the probe light from the surface. In this way, a total internal reflection arrangement can be used such that the probe light excites fluorescence only a few tens of nanometers into the sample from the planar surface of the lens. Fine control of the geometry of the probe light beam passing through the objective 20 and aplanatic solid immersion lens to achieve the required total internal reflection or other illumination geometries can be achieved by adjustments to the steering arrangement 183 or other aspects of the probe light optics 18.

Image light from the sample passes through the aplanatic solid immersion lens and objective 20, to pass through the beam splitter 22 and arrive at the imaging element 24, such as an EMCCD (electron multiplying charge coupled device) camera. Along this path between the beam splitter 22 and the imaging device 24, image light optics 26 such as emission filters 262 chosen to pass the particular emissions wavelengths of fluorophores used to label the sample, and a tube lens 264 to focus the light to the imaging element, are provided.

Figure 5:
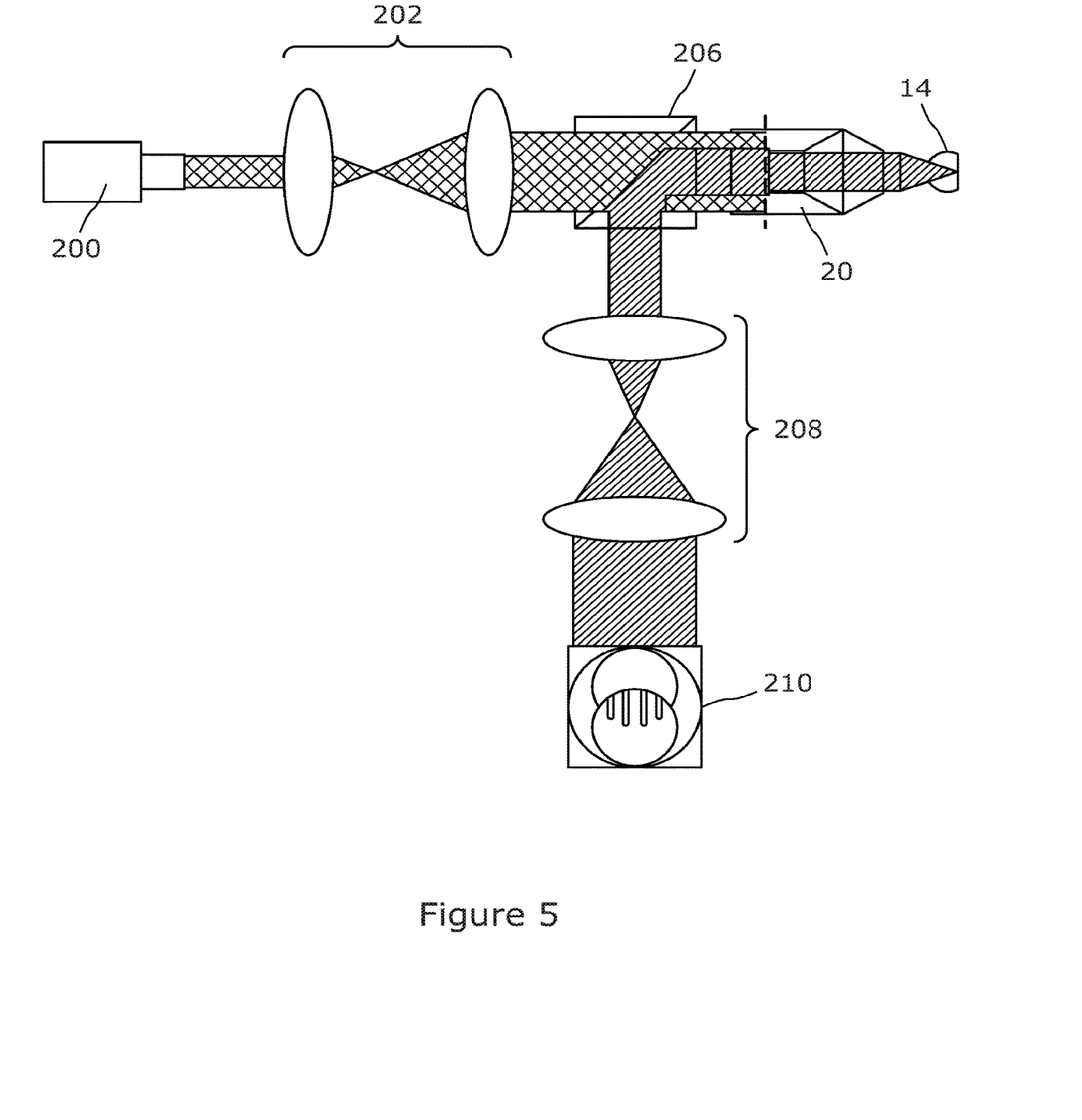
FIG. 5 illustrates an optical arrangement for aligning the discussed aplanatic solid immersion lens and objective lens.

Correct alignment of the objective 20 with the aplanatic solid immersion lens is important to obtain the best resolution images of the sample. A scheme to correctly align an aplanatic solid immersion lens 14 and the objective 20 is therefore illustrated in FIG. 5. A collimated beam generated by a laser diode 200 is expanded to cover the full aperture of the back focal plane of the combination of the aplanatic solid immersion lens 14 and objective lens 20 using a first beam expander arrangement 202. When the distance between the aplanatic solid immersion lens 14 and the objective lens 20 is adjusted to be correct or ideal, the incident beam is reflected by the flat distal surface 204 of the aplanatic solid immersion lens 14 and propagates back along the incident optical path. This reflection is separated by a beam splitter 206 and half of it is reflected into the second beam expander arrangement 208. The output beam is an expanded collimated beam, and then a parallel interference pattern, seen as bright and dark stripes, can be observed in a shear plate 210.

The invention may be used to implement correlative imaging of a sample or of an array of samples in which image data acquired using the cryogenic super-resolution microscopy technique discussed above is combined or correlated with image data acquired using electron microscopy and/or X-ray microscopy also carried out with the sample or samples located in a cryogenic environment. To this end, FIG. 6 is a flow chart illustrating a method of correlative imaging.

Figure 6:
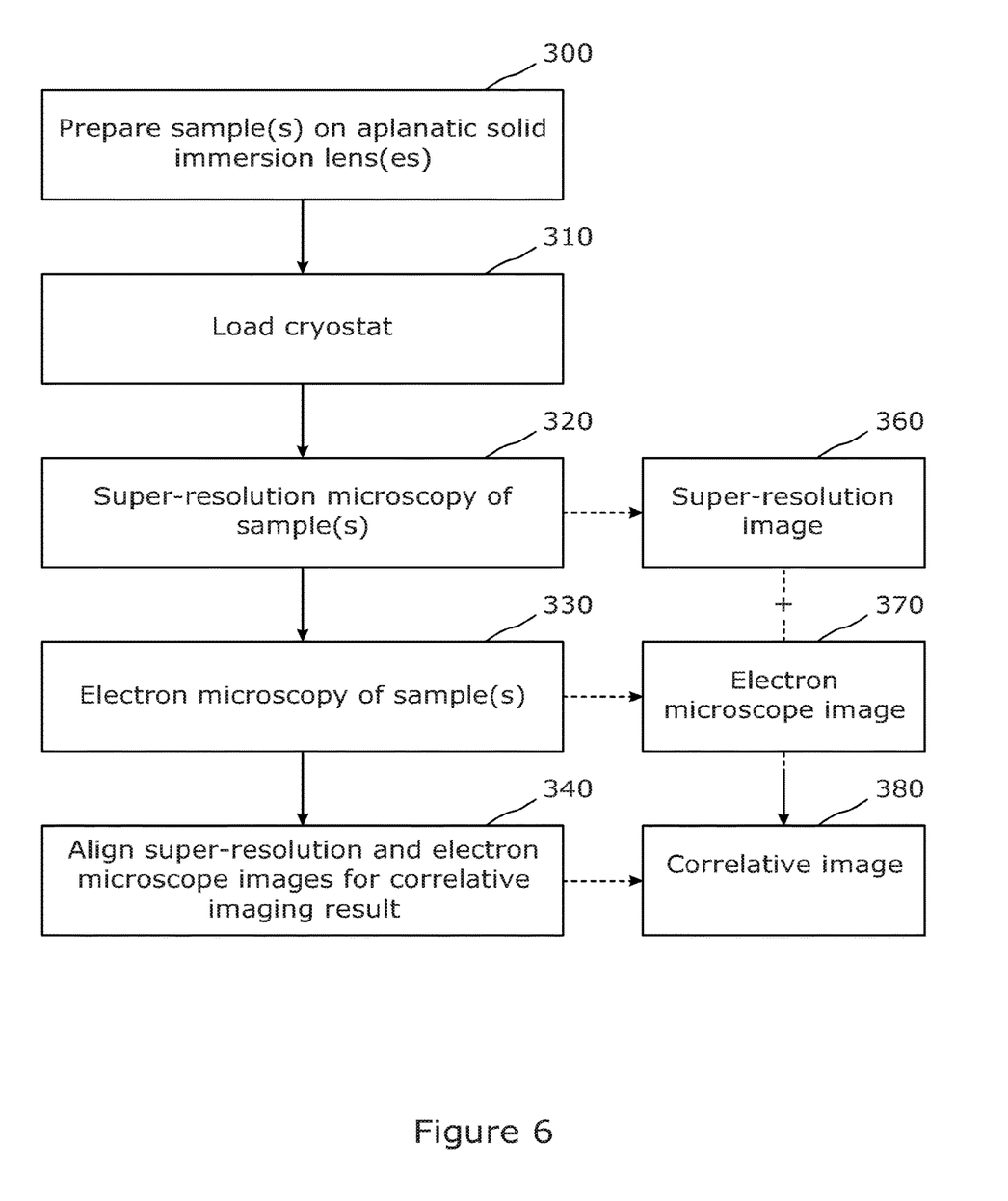
FIG. 6 provides a flow chart of methods for correlative imaging.

In step 300 of FIG. 6 a sample is prepared, for example as discussed in more detail elsewhere in this document, in contact or immediately adjacent to the planar face of an aplanatic solid immersion lens. This preparation step may be repeated for a plurality of samples, each sample being disposed in contact or immediately adjacent to the planar face of a different aplanatic solid immersion lens of a lens array such as an array as illustrated in FIG. 2A. The aplanatic solid immersion lens or lens array, with samples prepared, may then be loaded into a cryostat 50 such as that illustrated in FIG. 3, as shown in step 310 of FIG. 6.

The sample or each sample in an array of samples is then subject to a cryogenic super-microscopy technique as described elsewhere in this document in order to obtain super-resolution image data 360 of the sample.

Having obtained the super-resolution image data 360, the sample or each sample is then subject to an electron microscopy technique in step 330 of FIG. 6 in order to obtain electron microscopy image data 370 of the sample. Conveniently, having prepared each sample to be in contact with or adjacent to an aplanatic solid immersion lens used for the super-resolution microscopy step 320, the aplanatic solid immersion lens can continue to act as a support for the sample during the electron microscopy step 330. If an array of aplanatic solid immersion lenses is used then the same array of lenses along with the prepared samples, can be transferred from a super-resolution microscopy arrangement such as that of FIG. 1 to an electron microscope arrangement without significant disturbance of the samples. If a cryostat 50 such as that of FIG. 3 is used to house the aplanatic solid immersion lens or lens array and associated samples during the super-resolution microscopy process, then the lens or lens array may remain in place in the same cryostat for transfer to and use within the electron microscope arrangement.

The electron microscope arrangement may provide various different types of electron microscopy for imaging the sample such as scanning electron microscope (SEM) and transmission electron microscope (TEM) arrangements. For some such techniques, further preparation of the sample or samples may be appropriate before the super-resolution microscopy step 320 and before the electron microscopy step 330, for example heavy metal staining of samples for TEM imaging. If required, the super-resolution microscopy and electron microscopy stages of FIG. 6 may be reversed, and/or other microscopy stages, for example including other imaging stages of the same or different microscopy, super-microscopy, and electron microscopy techniques. X-ray microscopy techniques such as a soft X-ray microscopy technique may be used as well as or instead of an electron microscopy technique.

Having obtained super-resolution image data 360 and electron microscopy image data 370 of the same sample or samples, these image data pairs may be aligned or correlated, for example, using fiducial markers or feature detection algorithms, such that structural features in the sample are coincident. Such alignment may then be used, if required, to combine the super-resolution image data 360 and electron or X-ray microscopy image data 370 to form a combined or correlative image 380 of the sample.

Such a combined or correlative image 380 of the sample may provide significant benefits over either of the super-microscopy image 360 or the electron or X-ray-microscopy image considered separately. For example, correlative light and electron or X-ray microscopy offers a multi-modality imaging solution of molecular distribution and organisation of specific biomolecules in the context of cellular ultrastructure.

Although particular embodiments of the invention have been described, the skilled person will appreciate that various modifications and variations may be made without departing from the scope of the invention. For example, apart from single molecule localisation microscopy, other established super-resolution microscopy techniques, such as structured illumination microscopy and stimulated emission depletion (STED) microscopy, can also be combined with solid immersion lens microscopy.

The invention claimed is:

1. An array of aplanatic solid immersion lenses for use in cryogenic super-resolution optical microscopy, the array comprising a plurality of aplanatic solid immersion lens integrally formed with, or bonded to, a substrate.

2. The array of claim 1 wherein a planar surface of the substrate provides the planar optical surface of each of the aplanatic solid immersion lenses.

3. The array of aplanatic solid immersion lenses of claim 1, further comprising a separate sample provided on or adjacent to the planar surface of each aplanatic solid immersion lens, each such sample for imaging using cryogenic super-resolution optical microscopy.

4. The array of aplanatic solid immersion lenses of claim 3 wherein each sample is a vitrified sample.

5. The array of aplanatic solid immersion lenses of claim 3 wherein the samples are held in a cryogenic environment which is at least one of: a temperature of less than 200 Kelvin; a temperature of less than 100 Kelvin; maintained using liquid nitrogen; and maintained using nitrogen vapour.

6. The array of aplanatic solid immersion lenses of claim 1 wherein the array is formed of a material having a refractive index of at least 2.0.

7. The array of aplanatic solid immersion lenses of claim 1 wherein the array is formed of a material having a hardness on the Mohs scale of at least 8.0.

8. The array of aplanatic solid immersion lenses of claim 1 wherein the array is formed of a crystalline material.

9. The array of aplanatic solid immersion lenses of claim 1 wherein the array is formed of zirconium dioxide.

10. The array of aplanatic solid immersion lenses of claim 1 wherein the substrate is circular.

11. The array of aplanatic solid immersion lenses of claim 1 wherein the diameter or length of the substrate is 50 mm or less.

12. A method of forming an array of aplanatic solid immersion lenses for use in cryogenic super-resolution optical microscopy, the method comprising forming the plurality of aplanatic solid immersion lenses integrally with a substrate.

13. The method of claim 12 wherein the method comprises using diamond turning to form the array.

14. The method of claim 12 wherein the array is formed of a crystalline material.

15. The method of claim 12 wherein the array is formed of a material having a hardness on the Mohs scale of at least 8.0 and a refractive index of at least 2.0.

16. The method of claim 12 wherein the method comprises 3D printing the array.

17. The method of claim 16 wherein the array is formed of a plastics material having a refractive index of at least 1.4.

18. The method of claim 12 wherein the array is formed using a sol-gel process.

19. An array of solid immersion lenses integrally formed with a substrate for use in a cryogenic environment, the array being formed by diamond turning of a crystalline material having a refractive index of at least 2.0.

20. The array of solid immersion lenses of claim 19 wherein the substrate is substantially circular with a diameter of 50 mm or less.

* * * * *